United States Patent
Komposch et al.

(10) Patent No.: US 9,373,577 B2
(45) Date of Patent: Jun. 21, 2016

(54) HYBRID SEMICONDUCTOR PACKAGE

(71) Applicant: Infineon Technologies North America Corp., Milpitas, CA (US)

(72) Inventors: Alexander Komposch, Morgan Hill, CA (US); Brian William Condie, Morgan Hill, CA (US); Erwin Orejola, Morgan Hill, CA (US); Michael Real, Morgan Hill, CA (US)

(73) Assignee: Infineon Technologies AG, Neubiberg (DE)

(*) Notice: Subject to any disclaimer, the term of this patent is extended or adjusted under 35 U.S.C. 154(b) by 227 days.

(21) Appl. No.: 13/899,048

(22) Filed: May 21, 2013

(65) Prior Publication Data

US 2014/0346637 A1 Nov. 27, 2014

(51) Int. Cl.
*H01L 23/00* (2006.01)
*H01L 23/50* (2006.01)
*H01L 23/34* (2006.01)
*H01L 23/047* (2006.01)
*H01L 23/057* (2006.01)

(Continued)

(52) U.S. Cl.
CPC .............. *H01L 23/50* (2013.01); *H01L 23/047* (2013.01); *H01L 23/057* (2013.01); *H01L 23/315* (2013.01); *H01L 23/34* (2013.01); *H01L 23/66* (2013.01); *H01L 24/48* (2013.01); *H01L 24/49* (2013.01); *H01L 24/85* (2013.01); *H01L 24/36* (2013.01); *H01L 24/45* (2013.01); *H01L 24/73* (2013.01); *H01L 2223/6611* (2013.01); *H01L 2223/6655* (2013.01); *H01L 2224/45014* (2013.01); *H01L 2224/45015* (2013.01); *H01L 2224/45124* (2013.01); *H01L 2224/45144* (2013.01); *H01L 2224/45147* (2013.01); *H01L 2224/45565* (2013.01); *H01L 2224/48247* (2013.01); *H01L 2224/4903* (2013.01); *H01L 2224/4909* (2013.01); *H01L 2224/49051* (2013.01); *H01L 2224/49175* (2013.01); *H01L 2224/49505* (2013.01); *H01L 2224/85* (2013.01); *H01L 2924/00014* (2013.01);

(Continued)

(58) Field of Classification Search
CPC ........................................................ H01L 23/34
See application file for complete search history.

(56) References Cited

U.S. PATENT DOCUMENTS

2007/0024374 A1* 2/2007 Blair et al. .................... 330/302

FOREIGN PATENT DOCUMENTS

| JP | 2001308137 A | 11/2001 |
|----|--------------|---------|
| KR | 20010080542  | 8/2001  |

OTHER PUBLICATIONS

Author Unknown. "AN10896 Mounting and Soldering of RF Transistors." Application Note, Revision 2. NXP Semiconductors, Nov. 13, 2012. pp. 1-49.

(Continued)

*Primary Examiner* — William Harriston
(74) *Attorney, Agent, or Firm* — Murphy, Bilak & Homiller, PLLC

(57) ABSTRACT

A semiconductor package includes a substrate, an RF semiconductor die attached to a first side of the substrate, a capacitor attached to the first side of the substrate, and a first terminal on the first side of the substrate. The semiconductor package further includes copper or aluminum bonding wires or ribbons connecting the first terminal to an output of the RF semiconductor die, and gold bonding wires or ribbons connecting the capacitor to the output of the RF semiconductor die. The gold bonding wires or ribbons are designed to accommodate greater RF Joule heating during operation of the RF semiconductor die than the copper or aluminum bonding wires or ribbons. Corresponding methods of manufacturing are also described.

22 Claims, 3 Drawing Sheets

(51) Int. Cl.
*H01L 23/31* (2006.01)
*H01L 23/66* (2006.01)
*H02M 7/00* (2006.01)
*H04B 1/44* (2006.01)

(52) U.S. Cl.
CPC ......... *H01L 2924/181* (2013.01); *H02M 7/003* (2013.01); *H04B 1/44* (2013.01)

(56) References Cited

OTHER PUBLICATIONS

S.J.C.H. Theeuwen, et al. "LDMOS Transistors in Power Microwave Applications." Publication date unknown, can be accessed online at http://www.nxp.com/documents/other/ldmos_transistors_in_power_microwave_applications.pdf.

* cited by examiner

HYBRID SEMICONDUCTOR PACKAGE

TECHNICAL FIELD

This application relates to semiconductor packages, and more particularly to semiconductor packages with bonding wires or ribbons designed for different maximum operating temperatures.

BACKGROUND

High reliability, low-cost bonding wires are desirable for RF semiconductor packages. Bonding wires for such packages are typically made of gold, aluminum or copper. Some of these bonding wires function as tuning wires for an output match network connected to the RF power device. The tuning wires are subjected to significantly higher temperatures compared to the other bonding wires included in the package for input and output connections. For example, the temperature of the tuning wires often exceeds about 150° C. to 160° C., and even 200° C. in certain applications, due to RF Joule heating, i.e., ohmic heating and resistive heating whereby the tuning wires release heat as a result of electric current passing through the wires at RF frequencies.

Gold bonding wires can accommodate higher temperatures caused by RF Joule heating as compared to aluminum and copper bonding wires, but gold is significantly more expensive. Unprotected copper bonding wires readily oxidize in the presence of oxygen. Copper oxide growth is a function of temperature and time. The lifetime of an RF power device can, therefore, be predicted and meet minimum requirements. The critical (maximum) temperature for copper tuning wires depends on various conditions such as device electrical sensitivity, element, alloy, time and temperature, and is typically about 150° C., below which oxide growth is not problematic for most device useful lifetimes, e.g., 20 years. Copper bonding wires can be coated with an anti-oxidation layer such as palladium, but still oxidize at temperatures above 150° C. to 160° C. over long periods of time. Aluminum bonding wires are less sensitive to the temperature issues described above as compared to copper bonding wires, and have a self-passivating oxide layer that limits further oxidation. However, aluminum bonding wires have reduced electrical and thermal conductivity compared to copper and gold bonding wires. Fuse current is also significantly lower.

High bonding wire temperatures have been addressed in other ways for RF power packages. For example, the design time can be increased so that enough simulations can be run to yield reduced tuning wire temperatures. Integrated passive devices can be added to the package to realize the preferred matching, reducing the need for matching with tuning wires. The product can be de-rated to lower the current within the tuning wires. The number of bonding wires can be increased. Also, the bonding wire diameter can be increased. In each case, a better way of addressing the heating of certain bonding wires within an RF power package is desirable.

SUMMARY

According to an embodiment of a semiconductor package, the package comprises a substrate, an RF semiconductor die attached to a first side of the substrate, a capacitor attached to the first side of the substrate, and a first terminal on the first side of the substrate. The package further comprises copper or aluminum bonding wires or ribbons connecting the first terminal to an output of the RF semiconductor die, and gold bonding wires or ribbons connecting the capacitor to the output of the RF semiconductor die. The gold bonding wires or ribbons are designed to accommodate greater RF Joule heating during operation of the RF semiconductor die than the copper or aluminum bonding wires or ribbons.

According to an embodiment of a method of manufacturing a semiconductor package, the method comprises: attaching an RF semiconductor die to a first side of a substrate; attaching a capacitor to the first side of the substrate; disposing a first terminal on the first side of the substrate; connecting the first terminal to an output of the RF semiconductor die via copper or aluminum bonding wires or ribbons; and connecting the capacitor to the output of the RF semiconductor die via gold bonding wires or ribbons, the gold bonding wires or ribbons designed to accommodate greater RF Joule heating during operation of the RF semiconductor die than the copper or aluminum of bonding wires or ribbons.

According to another embodiment of a semiconductor package, the package comprises a metal substrate, an electrically insulating member attached to the metal substrate, an RF semiconductor die having a source terminal attached to the metal substrate and a gate terminal and a drain terminal facing away from the metal substrate, an input capacitor having a first terminal attached to the metal substrate and a second terminal facing away from the metal substrate, and an output capacitor having a first terminal attached to the metal substrate and a second terminal facing away from the metal substrate. The package further comprises an input terminal attached to the electrically insulating member and an output terminal attached to the electrically insulating member. A first group of copper or aluminum bonding wires or ribbons connects the output terminal to the drain terminal of the RF semiconductor die. Gold bonding wires or ribbons connect the second terminal of the output capacitor to the drain terminal of the RF semiconductor die. The gold bonding wires or ribbons are designed to accommodate greater RF Joule heating during operation of the RF semiconductor die than the first group of copper or aluminum bonding wires or ribbons. A second group of copper or aluminum bonding wires or ribbons connect the input terminal to the second terminal of the input capacitor and the second terminal of the input capacitor to the gate terminal of the RF semiconductor die.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, a semiconductor package includes bonding wires or ribbons which are expected to exceed a particular temperature during operation of a transistor die included in the package. These bonding wires or ribbons are made of gold. Other bonding wires or ribbons included in the package and expected to remain at lower temperatures are made of a material other than gold such as aluminum or copper. This way, the bonding wires or ribbons designed to be the hottest during device operation can handle relatively high operating temperatures over the lifetime of the device without failure and/or oxidization. The remaining bonding wires or ribbons are made of a less expensive material which can reliably function over the lifetime of the device at lower temperatures.

Bonding wires typically have a (generally) circular cross-section and bonding ribbons typically have a (generally) rectangular cross-section. Various standard bonding techniques such as ball bonding, wedge bonding, etc. can be employed to attach bonding wires or ribbons to terminals or substrates of a semiconductor package. In general, an intermetallic interface, bond or weld is produced between each bonding wire or ribbon and a terminal or substrate of the package. Some of the bonding wires/ribbons are subjected to higher temperatures during operation of the device(s) included in the package as compared to the remainder of the bonding wires/ribbons. For example, some of the bonding wires/ribbons may be used as tuning wires in an input or output match network of an RF power device. Current flows in these bonding wires/ribbons at RF frequencies, heating the bonding wires/ribbons to temperatures which can exceed 160° C. or even 200° C. or more. In some applications, such RF Joule heating in the bonding wires/ribbons can approach or even exceed 300° C. These bonding wires/ribbons comprise predominantly gold, e.g., 99.99% pure Au or Au alloy. The remaining bonding wires/ribbons comprise predominantly a material other than gold such as aluminum (e.g. pure Al or Al alloys) or copper (e.g. pure Cu or Cu alloys with or without a passivation layer such as palladium). This way, the gold bonding wires/ribbons can reliably accommodate relatively high temperatures and the remaining (non-gold) bonding wires/ribbons can reliably accommodate lower temperatures at reduced cost.

Figure 1:
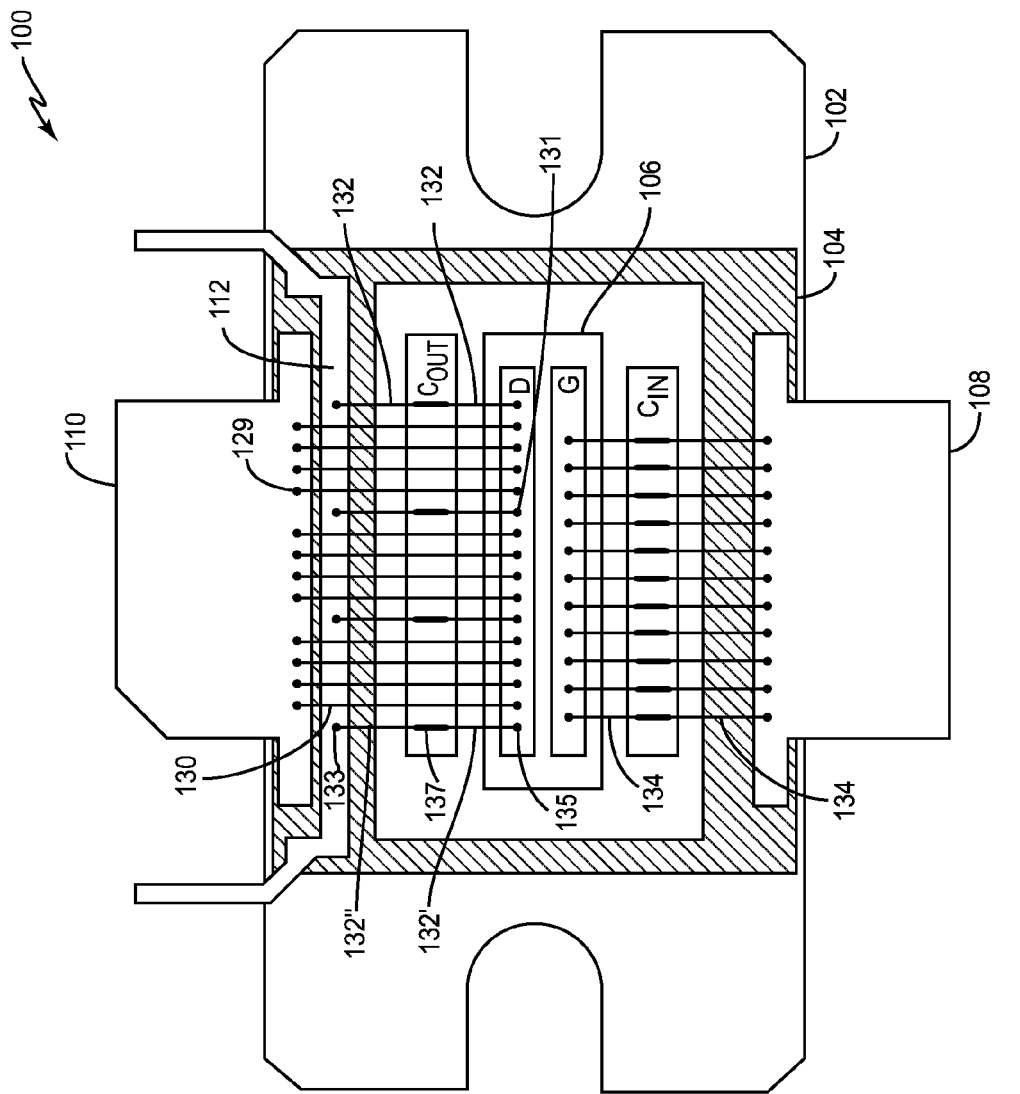
FIG. 1 illustrates a top-down plan view of an embodiment of a hybrid semiconductor package.
Figure 2:
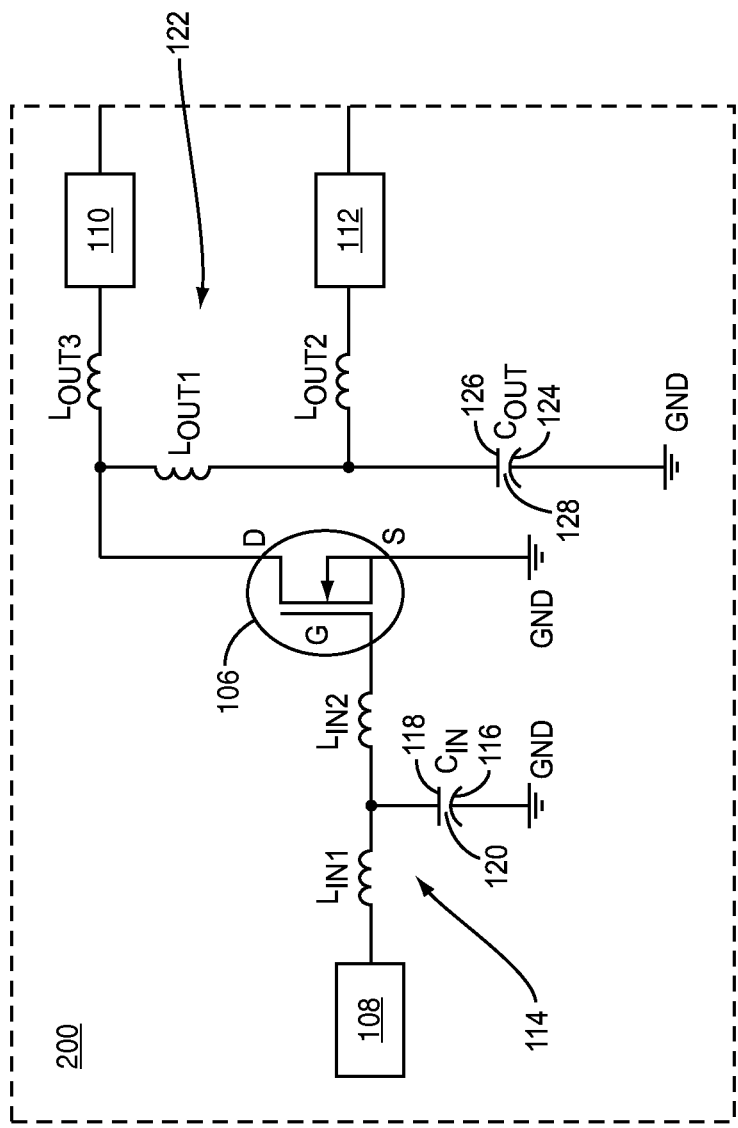
FIG. 2 illustrates a schematic diagram of an exemplary RF power circuit included in the hybrid semiconductor package of FIG. 1.

FIG. 1 illustrates a top-down plan view of an embodiment of a semiconductor package 100, and FIG. 2 illustrates a circuit schematic of an RF power circuit 200 housed in the package 100. In one embodiment, the semiconductor package 100 is an RF power air cavity package. The package lid is not shown in FIG. 1 for ease of illustration. In other embodiments, the contents of the package 100 are encased in a mold compound such as an epoxy.

In either case, the package 100 includes a substrate 102, such as a metal flange, and an electrically insulating window 104, such as a ceramic window attached to the substrate 102 in the case of an electrically conductive substrate 102. Alternatively, the substrate 102 can be electrically insulating. A transistor die 106 is attached to an inner part of the metal substrate 102 uncovered by the insulating window 104. The transistor die 106 can include any type of power transistor such as an LDMOS (laterally diffused metal oxide semiconductor), DMOS (double-diffused MOS), SiC or GaN transistor. In one embodiment, the transistor die 106 is an RF semiconductor die having a source terminal (S) attached to the metal substrate 102. The source terminal can be grounded by the substrate 102 in the case the substrate 102 is made of metal. The gate terminal (G) and drain terminal (D) of the die 106 face away from the metal substrate 102. In the case of an electrically insulating substrate 102, all terminals of the transistor die 106 are disposed at a side of the die 106 facing away from the substrate 102. The opposing side of the transistor die 106 can be glued or otherwise attached to the electrically insulating substrate 102 of the package 100.

The package 100 further includes an input terminal 108, an output terminal 110 and a DC bias terminal 112 attached to the electrically insulating member 104. In the case of an electrically insulating substrate 102, the insulating member 104 can be omitted and the terminals 108, 110, 112 attached directly to the substrate 102. The DC bias terminal 112 is optional and can be omitted from the package 100 in the case DC bias is applied via the output terminal 110.

The package 100 also includes an input match network 114 coupled between the input terminal 108 of the package 100 and the gate terminal (G) of the transistor die 106. The input match network 114 includes a DC blocking capacitor $C_{IN}$ with a first terminal 116 separated from a second terminal 118 by an insulator 120. A first conductive branch $L_{IN1}$ of the input match network 114 connects the input terminal 108 of the package 100 to the second terminal 118 of the input capacitor $C_{IN}$. A second conductive branch $L_{IN2}$ of the input match network 114 connects the second terminal 118 of the input capacitor $C_{IN}$ to the gate terminal of the transistor die 106. The first terminal 116 of the input capacitor $C_{IN}$ is coupled to a ground node (GND), e.g., via attachment to the substrate 102 in the case where the substrate 102 is made of metal.

An output match network 122 is coupled between the drain terminal (D) of the transistor die 106 and the output and DC bias terminals 110, 112 of the package 100. The output match network 122 includes a DC blocking capacitor $C_{OUT}$ with a first terminal 124 separated from a second terminal 126 by an insulator 128. A first conductive branch $L_{OUT1}$ of the output match network 122 connects the drain terminal of the transistor die 106 to the second terminal 126 of the DC blocking capacitor $C_{OUT}$. A second conductive branch $L_{OUT2}$ of the output match network 122 connects the second terminal 126 of the DC blocking capacitor $C_{OUT}$ to the DC bias terminal 112 of the package 100. The first terminal 124 of the DC blocking capacitor $C_{OUT}$ is coupled to a ground node (GND) e.g. via attachment to the substrate 102 in the case the substrate 102 is made of metal, thus providing an RF/baseband 'cold point' path to ground between the first and second conductive branches $L_{OUT1}$ and $L_{OUT2}$ of the output match network 122. A third conductive branch $L_{OUT3}$ of the output match network 122 connects the drain terminal of the transistor die 106 to the output terminal 110 of the package 100. The source terminal (S) of the transistor die 106 is coupled to a ground node (GND).

The capacitors of the input and output match networks 114, 122 can be implemented as discrete components separate from the transistor die 106, or can be integrated with the transistor on the same die. The input and output match networks 114, 122 can have other configurations, as is readily known in the art, and, therefore, no further explanation is given in this regard. External terminals and capacitors (not shown) can be coupled to the output terminal 110 of the package 100 for coupling to the output of the transistor die 106. The package 100 can include more than one die 106 e.g. a plurality of dies 106 connected in parallel. DC bias ($V_{DD}$) can be applied at the DC bias terminal 112 of the package 100 for ensuring proper biasing of the transistor die 106. DC blocking capacitors (not shown) can be externally coupled to the DC bias terminal 112 of the package 100. In some embodiments, the DC bias terminal 112 provides a point that is "cold," i.e., terminated/virtually grounded at baseband and RF via the output capacitor $C_{OUT}$.

The conductive branches $L_{IN1}, L_{IN2}, L_{OUT1}, L_{OUT2}, L_{OUT3}$ of the input and output match networks 114, 122 are implemented as bonding wires or ribbons. In one embodiment, a first group of copper or aluminum bonding wires or ribbons 130 connects the output terminal 110 of package 100 to the output (e.g., drain terminal) of the transistor die 106. With reference to the circuit schematic of FIG. 2, the first group of copper or aluminum bonding wires or ribbons 130 corresponds to conductive branch $L_{OUT3}$ of the output match network 122. In the case the outermost bonding wires or ribbons connecting the output terminal 110 of package 100 to the output of the transistor die 106 are expected to be hotter than the inner ones e.g. above 160° C. due to mutual inductance, the outermost ones of these bonding wires or ribbons can be gold and the bonding wires or ribbons in the inner part of the array can be copper or aluminum.

Gold bonding wires or ribbons 132 connect the DC bias terminal 112 (or output terminal 110 if the DC bias terminal 112 is omitted) of the package 100 to the second terminal 126 of the output capacitor $C_{OUT}$ and the second terminal 126 of the output capacitor $C_{OUT}$ to the output of the transistor die 106. Alternatively, a first part 132' of this connection can be provided by gold bonding wires or ribbons that connect the second terminal 126 of the output capacitor $C_{OUT}$ to the output of the transistor die 106. A second part 132" of this connection can be provided by copper or aluminum bonding wires or ribbons that connect the DC bias terminal 112 (or output terminal 110 if the DC bias terminal 112 is omitted) of the package 100 to the second terminal 126 of the output capacitor $C_{OUT}$.

With reference to the circuit schematic of FIG. 2, the gold bonding wires or ribbons 132 corresponds to at least conductive branch $L_{OUT1}$ and possibly also conductive branch $L_{OUT2}$ of the output match network 122, depending on whether $L_{OUT2}$ is implemented with gold, copper or aluminum bonding wires or ribbons. In one case, conductive branch $L_{OUT1}$ (section 132' in FIG. 1) is implemented with gold bonding wires or ribbons and conductive branch $L_{OUT2}$ (section 132" in FIG. 1) is implemented with copper or aluminum bonding wires or ribbons. In another case, both conductive branches $L_{OUT1}$ and $L_{OUT2}$ are implemented with gold bonding wires or ribbons. In either case, the gold bonding wires or ribbons 132 are designed to accommodate greater RF Joule heating during operation of the transistor die 106 than the first group of copper or aluminum bonding wires or ribbons 130.

A second group of copper or aluminum bonding wires or ribbons 134 connects the input terminal 108 of the package 100 to the second terminal 118 of the input capacitor $C_{IN}$ and the second terminal 118 of the input capacitor $C_{IN}$ to the gate terminal (G) of the transistor die 106. The term 'gold bonding wires or ribbons' as used herein describes bonding wires or ribbons comprising predominantly gold, e.g., 99.99% pure Au or gold alloy. The term 'copper or aluminum bonding wires or ribbons' as used herein describes bonding wires or ribbons comprising predominantly aluminum (e.g. pure Al or Al alloys) or copper (e.g. pure Cu or Cu alloys with or without a passivation layer such as palladium).

Figure 3:
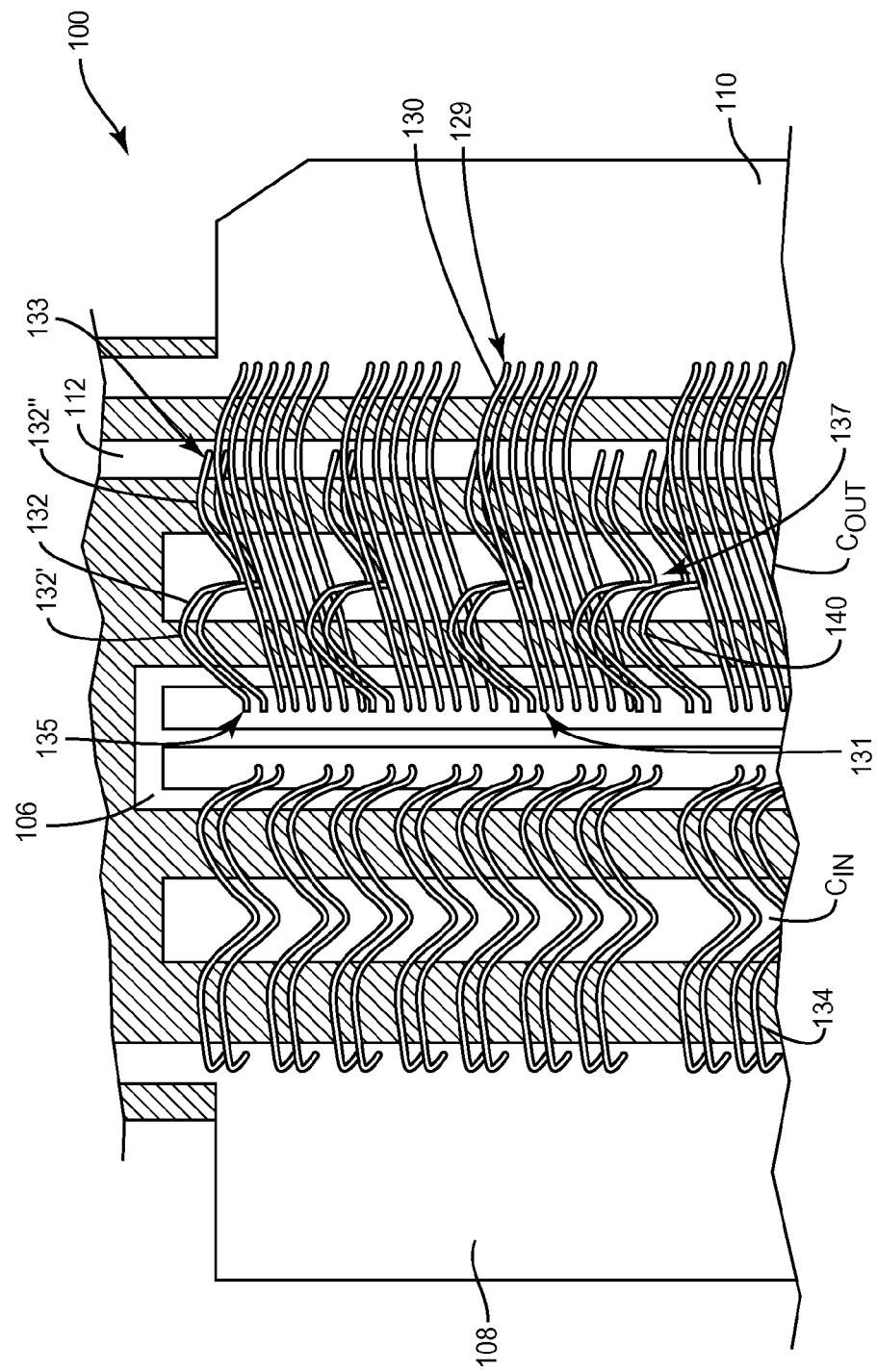
FIG. 3 illustrates a side perspective view of part of the hybrid semiconductor package of FIG. 1 according to an embodiment.

FIG. 3 illustrates a side perspective of part of the semiconductor package 100 according to an embodiment. The first group of copper or aluminum bonding wires or ribbons 130 is attached to the output terminal 110 of the package 100 at a first end 129 and to the output (e.g., drain terminal) of the transistor die 106 at a second end 131. The gold bonding wires or ribbons 132 are attached to the DC bias terminal 112 (or output terminal 110 if the DC bias terminal 112 is omitted) of the package 100 at a first end 133, to the output of the transistor die 106 at a second end 135 and to the second terminal 126 of the DC blocking capacitor $C_{OUT}$ at an intermediate region 137 between the first and second ends 133, 135. In another embodiment, the gold bonding wires or ribbons 132 provide the first part 132' of this connection and only connect the output of the transistor die 106 to the second terminal 126 of the DC blocking capacitor $C_{OUT}$. Copper or aluminum bonding wires or ribbons provide the second part 132" of the connection from the second terminal 126 of the DC blocking capacitor $C_{OUT}$ to the DC bias terminal 112 (or output terminal 110 if the DC bias terminal 112 is omitted) of the package 100. In either case, the gold bonding wires or ribbons 132 can be kinked i.e. have a tightly curled, twisted, or bent region 140 between the point of attachment to the DC blocking capacitor $C_{OUT}$ and the point of attachment to the transistor die 106.

Each terminal 108, 110, 112 of the package 100 is illustrated in the accompanying Figures as a single continuous bond strip or pad to which all of the corresponding bonding wires or ribbons 130/132/134 are attached. Alternatively, one or more of the package terminals 108, 110, 112 can be realized by a plurality of bond pads. In either case, the first group of copper or aluminum bonding wires or ribbons 132 can be attached to the output terminal 110 of the package 100 via one or more aluminum bond pads and to the output of the transistor die 106 via one or more aluminum or gold bond pads. The gold bonding wires or ribbons 132 can be attached to the DC bias terminal 112 (or output terminal 110 if the DC bias terminal 112 is omitted) of the package 100, the output of the transistor die 106 and the DC blocking capacitor $C_{OUT}$ via gold bond pad(s). In one embodiment, the first group of copper or aluminum bonding wires or ribbons 130 and the gold bonding wires or ribbons 132 are attached to the output of the transistor die 106 via one or more shared (common) bond pads which are represented by the drain terminal (D) of the die 106 in FIGS. 1 and 3. With such a configuration, the shared bond pad(s) are made of a material sufficient to reliably accommodate bonding wires or ribbons of dissimilar materials. For example, the one or more shared bond pads can comprise Ti, Pt and Au.

In general, the gold bonding wires or ribbons are designed to function at significantly higher temperatures than the aluminum or copper bonding wires or ribbons included in the same package. In the case of an RF power device, the gold bonding wires or ribbons can function as tuning wires. However, the embodiments of gold and aluminum/copper bonding wires or ribbons described herein can be used for any application where Joule heating causes certain ones of the bonding wires or ribbons to generate greater heat than other ones of the bonding wires or ribbons. In general, the copper or aluminum bonding wires or ribbons connect a terminal of a semiconductor package to an output (e.g. a drain terminal) of a transistor die. The gold bonding wires or ribbons connect a capacitor to the output of the transistor die, and are designed to accommodate greater RF Joule heating during operation of the RF semiconductor die than the copper or aluminum bonding wires or ribbons. In one embodiment, the maximum temperature of the copper or aluminum bonding wires or ribbons is below about 150° C. to 160° C. during operation of the transistor die, and the maximum temperature of the gold bonding wires or ribbons is above 160° C. during operation of the transistor die, e.g., above 200° C. or even approaching or exceeding 300° C. The copper or aluminum bonding wires or ribbons can have the same cross-sectional area as the gold bonding wires or ribbons. Alternatively, the copper or aluminum bonding wires or ribbons can have a larger cross-sectional area than the gold bonding wires or ribbons.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc., and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   a substrate;
   an RF semiconductor die attached to a first side of the substrate;
   a capacitor attached to the first side of the substrate;
   a first terminal on the first side of the substrate;
   copper or aluminum bonding wires or ribbons connecting the first terminal to an output of the RF semiconductor die; and
   gold bonding wires or ribbons connecting the capacitor to the output of the RF semiconductor die, the gold bonding wires or ribbons designed to accommodate greater RF Joule heating during operation of the RF semiconductor die than the copper or aluminum bonding wires or ribbons.

2. The semiconductor package of claim 1, wherein the RF semiconductor die is a GaN, SiC or LDMOS die having a source terminal attached to the first side of the substrate and a drain terminal and a gate terminal facing away from the substrate, wherein the copper or aluminum bonding wires or ribbons connect the first terminal to the drain terminal of the die, and wherein the gold bonding wires or ribbons connect the capacitor to the drain terminal of the die.

3. The semiconductor package of claim 1, further comprising a second terminal on the first side of the substrate, wherein the copper or aluminum bonding wires or ribbons are attached to the first terminal at a first end and to the output of the RF semiconductor die at a second end, and wherein the gold bonding wires or ribbons are attached to the second terminal at a first end, to the output of the RF semiconductor die at a second end and to the capacitor at an intermediate region between the first and second ends.

4. The semiconductor package of claim 1, wherein the gold bonding wires or ribbons are kinked between the point of attachment to the capacitor and the point of attachment to the output of the RF semiconductor die.

5. The semiconductor package of claim 3, wherein the copper or aluminum bonding wires or ribbons are attached to the first terminal via one or more aluminum bond pads and to the output of the RF semiconductor die via one or more aluminum or gold bond pads, and wherein the gold bonding wires or ribbons are attached to the first terminal or another terminal on the substrate, the output of the RF semiconductor die and the capacitor via gold bond pads.

6. The semiconductor package of claim 1, wherein the copper or aluminum bonding wires or ribbons and the gold bonding wires or ribbons are attached to the output of the RF semiconductor die via one or more shared bond pads.

7. The semiconductor package of claim 6, wherein the one or more shared bond pads comprises Ti, Pt and Au.

8. The semiconductor package of claim 1, wherein a maximum temperature of the copper or aluminum bonding wires or ribbons is below 160° C. during operation of the RF semiconductor die, and wherein a maximum temperature of the gold bonding wires or ribbons is above 160° C. during operation of the RF semiconductor die.

9. The semiconductor package of claim 1, wherein the copper or aluminum bonding wires or ribbons has a larger cross-sectional area than the gold bonding wires or ribbons.

10. The semiconductor package of claim 1, wherein the semiconductor package is an air cavity package.

11. The semiconductor package of claim 1, wherein the gold bonding wires or ribbons are tuning wires of an output match network.

12. The semiconductor package of claim 1, wherein the gold bonding wires or ribbons are attached to the first terminal at a first end, to the output of the RF semiconductor die at a second end and to the capacitor at an intermediate region between the first and second ends.

13. The semiconductor package of claim 1, wherein the gold bonding wires or ribbons connect the output of the RF semiconductor die to the capacitor and additional copper or aluminum bonding wires or ribbons connect the capacitor to the first terminal.

14. The semiconductor package of claim 1, further comprising additional gold bonding wires or ribbons forming an array with the copper or aluminum bonding wires or ribbons and also connecting the first terminal to the output of the RF semiconductor die, the copper or aluminum bonding wires or ribbons being disposed at an inner part of the array and the additional gold bonding wires or ribbons being disposed at an outer part of the array.

15. A method of manufacturing a semiconductor package, the method comprising:
    attaching an RF semiconductor die to a first side of a substrate;
    attaching a capacitor to the first side of the substrate;
    disposing a first terminal on the first side of the substrate;
    connecting the first terminal to an output of the RF semiconductor die via copper or aluminum bonding wires or ribbons; and
    connecting the capacitor to the output of the RF semiconductor die via gold bonding wires or ribbons, the gold bonding wires or ribbons designed to accommodate greater RF Joule heating during operation of the RF semiconductor die than the copper or aluminum of bonding wires or ribbons.

16. The method of claim 15, wherein connecting the capacitor to the output of the RF semiconductor die via the gold bonding wires or ribbons comprises:
    attaching a first end of the gold bonding wires or ribbons to the first terminal or another terminal on the substrate;
    attaching a second end of the gold bonding wires or ribbons to the output of the RF semiconductor die; and
    attaching an intermediate region of the gold bonding wires or ribbons between the first and second ends to the capacitor.

17. The method of claim 16, further comprising kinking the gold bonding wires or ribbons between the point of attachment to the capacitor and the point of attachment to the output of the RF semiconductor die.

18. The method of claim 15, wherein the copper or aluminum bonding wires or ribbons and the gold bonding wires or ribbons are attached to the output of the RF semiconductor die via one or more shared bond pads.

19. The method of claim 15, wherein a maximum temperature of the copper or aluminum bonding wires or ribbons is below 160° C. during operation of the RF semiconductor die, and wherein a maximum temperature of the gold bonding wires or ribbons is above 160° C. during operation of the RF semiconductor die.

20. A semiconductor package, comprising:
a metal substrate;
an electrically insulating member attached to the metal substrate;
an RF semiconductor die having a source terminal attached to the metal substrate and a gate terminal and a drain terminal facing away from the metal substrate;
an input capacitor having a first terminal attached to the metal substrate and a second terminal facing away from the metal substrate;
an output capacitor having a first terminal attached to the metal substrate and a second terminal facing away from the metal substrate;
an input terminal attached to the electrically insulating member;
an output terminal attached to the electrically insulating member;
a first group of copper or aluminum bonding wires or ribbons connecting the output terminal to the drain terminal of the RF semiconductor die;
gold bonding wires or ribbons connecting the second terminal of the output capacitor to the drain terminal of the RF semiconductor die, the gold bonding wires or ribbons designed to accommodate greater RF Joule heating during operation of the RF semiconductor die than the first group of copper or aluminum bonding wires or ribbons; and
a second group of copper or aluminum bonding wires or ribbons connecting the input terminal to the second terminal of the input capacitor and the second terminal of the input capacitor to the gate terminal of the RF semiconductor die.

21. The semiconductor package of claim 20, further comprising a DC bias terminal attached to the electrically insulating member, wherein the gold bonding wires or ribbons connect the DC bias terminal to the second terminal of the output capacitor and the second terminal of the output capacitor to the drain terminal of the RF semiconductor die.

22. The semiconductor package of claim 20, wherein the gold bonding wires or ribbons connect the drain terminal of the RF semiconductor die to the second terminal of the capacitor and additional copper or aluminum bonding wires or ribbons connect the second terminal of the capacitor to the output terminal or another terminal attached to the electrically insulating member.

* * * * *